United States Patent [19]

Nierescher et al.

[11] Patent Number: 4,840,576

[45] Date of Patent: Jun. 20, 1989

[54] ZERO INSERTION FORCE SOCKET FOR SURFACE-MOUNTED INTEGRATED CIRCUITS

[75] Inventors: David Nierescher, Renton; Douglas Yip, Bellevue, both of Wash.

[73] Assignee: Data I/O Corporation, Redmond, Wash.

[21] Appl. No.: 108,775

[22] Filed: Oct. 14, 1987

[51] Int. Cl.⁴ .................................. H01R 13/62
[52] U.S. Cl. ........................................... 439/331
[58] Field of Search ............................ 439/70–73, 439/330, 331, 525–526, 66, 67

[56] References Cited

U.S. PATENT DOCUMENTS

| | | | |
|---|---|---|---|
| H13 | 1/1986 | Vratny | 439/71 |
| 4,116,517 | 9/1978 | Selvin et al. | 439/67 |
| 4,554,505 | 11/1985 | Zachry | 439/71 |
| 4,571,015 | 2/1986 | Mueller | 439/71 |
| 4,593,961 | 6/1986 | Cosmo | 439/71 |
| 4,688,870 | 8/1987 | Egawa et al. | 439/331 |
| 4,717,346 | 1/1988 | Yoshizaki | 439/331 |

OTHER PUBLICATIONS

"P.L.C.C", Yamaichi Electronics, IC51 Series (1 sheet).

"New User Friendly Chip Carrier Sockets for Test and Burn In," Textool 3M, (3 pages).

*Primary Examiner*—Joseph H. McGlynn
*Attorney, Agent, or Firm*—Seed and Berry

[57] ABSTRACT

A zero insertion force socket for integrated circuits having a contact pattern formed on the upper surface of a resilient circuit on which an integrated circuit is adapted to be placed with its leads in contact with the contact pattern. A plurality of frames having different sized cutouts conforming to the shape of integrated circuit cases of different sizes are used to position integrated circuits having cases of different sizes at predetermined locations on the contact pattern. The positioning frames are pivotally mounted on a common pin, and they nest together so that at least some of the positioning frames fit within the rectangular cutout of the next larger positioning frame. In order to bias the integrated circuit into the resilient circuit, a lid having a plunger is positioned over the integrated circuit. The plunder contacts the upper surface of the integrated circuit case to force it against the resilient circuit either with a constant force or a constant displacement. The plunger may project through the lid when it is displaced by an integrated circuit in order to indicate that an integrated circuit is installed in said socket.

30 Claims, 4 Drawing Sheets

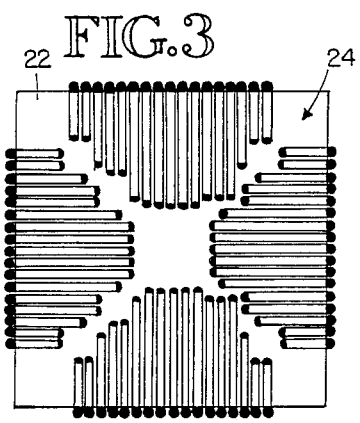
FIG.3
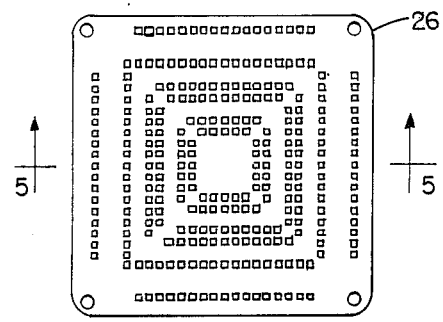
FIG.4
FIG.5
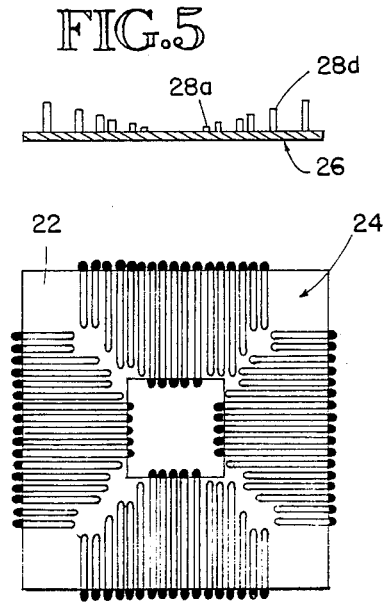
FIG.6
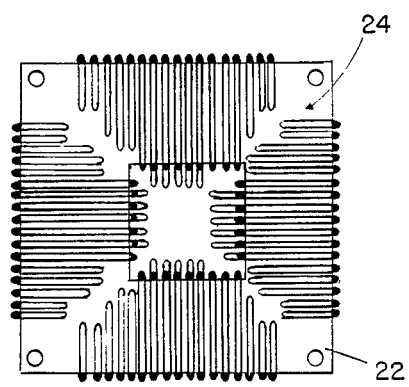
FIG.7

ZERO INSERTION FORCE SOCKET FOR SURFACE-MOUNTED INTEGRATED CIRCUITS

TECHNICAL FIELD

This invention relates to connector sockets for integrated circuits, and more particularly, to a multiple-use socket that quickly and easily allows integrated circuits to be installed in the socket.

BACKGROUND ART

Integrated circuits consist of a semiconductor chip containing a large number of transistors and other components housed in a ceramic or plastic case having a large number of leads projecting therefrom. The cases come in a variety of sizes and rectangular shapes, including square, and the number of leads generally varies with the size of the integrated circuit case. Integrated circuits are typically mounted on a printed circuit board either directly or through a socket. Integrated circuits that are mounted directly on a printed circuit board have leads that either project downwardly to extend through holes in the board or are substantially flush with the integrated circuit case and are soldered to mounting pads on the surface of the board. The surface-mounted integrated circuit leads are of two varieties. In one type of integrated circuit known as a plastic leaded chip carrier (PLCC), the leads project horizontally from the sides of the integrated circuit a short distance and then bend downwardly and then under the integrated circuit case. The other type of surface-mounted integrated circuit, known as a "leadless chip carrier (LCC)," utilizes mounting pads that are integrally formed on the underside of the case. In either case, the leads of the integrated circuits rest flushly on the top of printed circuit boards on which they are mounted. Thus, as used herein, the term "leads" includes not only the leads of PLCC integrated circuits, but also the mounting pads of LCC integrated circuits.

Many integrated circuits are mounted on printed circuit boards without prior testing or programming. However, in the event that an integrated circuit is to be tested prior to mounting on a printed circuit board, it must be inserted in a test device. The test device generally contains one or more sockets adapted to receive the integrated circuit. Similarly, some integrated circuits, such as programmable read-only memories and programmable logic arrays, must be inserted in a programming device prior to use. As with the testing devices, programming devices include one or more sockets into which the integrated circuit to be programmed is inserted. The sockets of the testing and programming devices are thus utilized a large number of times.

Conventional integrated circuit sockets used for mounting integrated circuits on a circuit board generally include contacts that are spring-biased against the integrated circuit leads when the integrated circuit is inserted into the socket. These conventional integrated circuit sockets can only undergo a relatively small number of insertion and removal cycles without seriously degrading the performance of the socket. Consequently, conventional testing and programming devices utilize zero insertion force sockets that can be used a large number of times without degradation in their operating performance. These conventional zero insertion force sockets generally include a lever or other mechanism for causing the socket conductors to make contact with the leads of the integrated circuit after the integrated circuit is inserted in the socket. When the integrated circuit is removed from the socket, the lever is actuated to move the socket conductors away from the integrated circuit leads so that the integrated circuit leads do not exert any force on the socket conductors. As a result, the socket can undergo a large number of insertion and removal cycles.

Another problem encountered with conventional testing and programming devices for integrated circuits is the need for a different socket for each of a wide variety of integrated circuits. As mentioned above, different integrated circuits have different sized cases and different numbers of leads. As a result, there must be a separate integrated circuit socket for each type of integrated circuit. This requirement makes conventional testing and programming devices unduly expensive, complex, and difficult to operate.

DISCLOSURE OF THE INVENTION

It is an object of the invention to provide an integrated circuit socket into which surface-mounted integrated circuits can be repetitively installed without degrading the operating performance of the socket.

It is another object of the invention to provide an integrated circuit socket that can be used with integrated circuits having a wide variety of sizes and shapes.

It is still another object of the invention to provide an integrated circuit socket that can be used without modification for integrated circuits having varying numbers of leads.

It is a further object of the invention to provide a socket for surface-mounted integrated circuits that produces a constant contact force between each lead of the integrated circuit and a contact pattern regardless of the thickness of the integrated circuit or the number of leads in the integrated circuit.

These and other objects of the invention are provided by a zero insertion force socket for integrated circuits having a base and a resilient circuit mounted on the base. The resilient circuit has a predetermined contact pattern on its upper surface that is adapted to make contact with the leads of the integrated circuit. A bias mechanism is positioned above the resilient circuit and adapted to contact the upper surface of the case of the integrated circuit when the integrated circuit is placed on the resilient circuit with its leads contacting the contact pattern. The bias mechanism compresses the resilient circuit to maintain the leads of the integrated circuit in contact with the contact pattern of the resilient circuit. The bias mechanism may be a rigid lid pivotally mounted on the base, with the lid contacting the upper surface of the integrated circuit when it is in its closed position. The lid may also include either a resiliently biased or adaptive, constant displacement plunger projecting downwardly from the lid toward the contact pattern when the lid is closed. The adaptive, constant displacement plunger forces the integrated circuit leads into the resilient circuit a fixed distance regardless of the thickness of the integrated circuit so that the force of each lead against the resilient circuit is constant regardless of the number of leads in the integrated circuit. In contrast, the resiliently biased plunger causes the integrated circuit to exert a constant force on the resilient circuit so that the force of each lead against the resilient circuit is inversely proportional to the number of leads in the integrated circuit. The plunger may also project through the lid when it is displaced by an integrated circuit in order to provide a visual indication when an integrated circuit is installed in the socket. The contact pattern preferably includes four sets of parallel, elongated, symmetrically arranged conductors, with the longitudinal axis of the conductors in each set being perpendicular to the longitudinal axis of the conductors in adjacent sets and parallel to the longitudinal axis of the conductors in the opposite set. The conductors at the ends of each set are preferably shorter in length than at least some of the conductors at the center of each set so that larger integrated circuits having additional leads make contact with a larger number of conductors positioned beneath the integrated circuit. The resilient circuit may be formed by a resilient pad mounted on the base and a flexible membrane mounted on the resilient pad, with the flexible membrane having the contact pattern formed thereon. The resilient circuit may also be formed by a rigid plate having a pattern of upwardly projecting resilient strips or dots positioned beneath the conductors at locations where the integrated circuit leads would make contact with the conductors. The strips or dots preferably project farther above the plate away from the center of the contact pattern to ensure that the inner strips or dots do not space the integrated circuit leads above the outer conductors. A positioning frame may be used to accurately position the integrated circuit on the contact pattern. The frame is mounted on the base, and it has a rectangular cutout adapted to surround the case of an integrated circuit. The center of the rectangular cutout is positioned over a predetermined location on the contact pattern. Several frames having respective rectangular cutouts may be used to position integrated circuits having different sizes. The frames are preferably nested together, with at least some of the frames fitting within respective rectangular cutouts of other frames.

BRIEF DESCRIPTION OF THE DRAWINGS

FIG. 3 is a plan view of the contact pattern formed on a resilient circuit used in the inventive integrated circuit socket.

FIG. 4 is a plan view of an alternative embodiment of a resilient circuit used in the inventive integrated circuit socket.

FIG. 5 is a cross-sectional view taken along the line 5—5 of FIG. 4.

FIG. 6 is a schematic showing the manner in which one integrated circuit interfaces with the contact pattern shown in FIG. 3.

FIG. 7 is a plan view of another example of an integrated circuit interfacing with the contact pattern shown in FIG. 3.

BEST MODE FOR CARRYING OUT THE INVENTION

Figure 1:
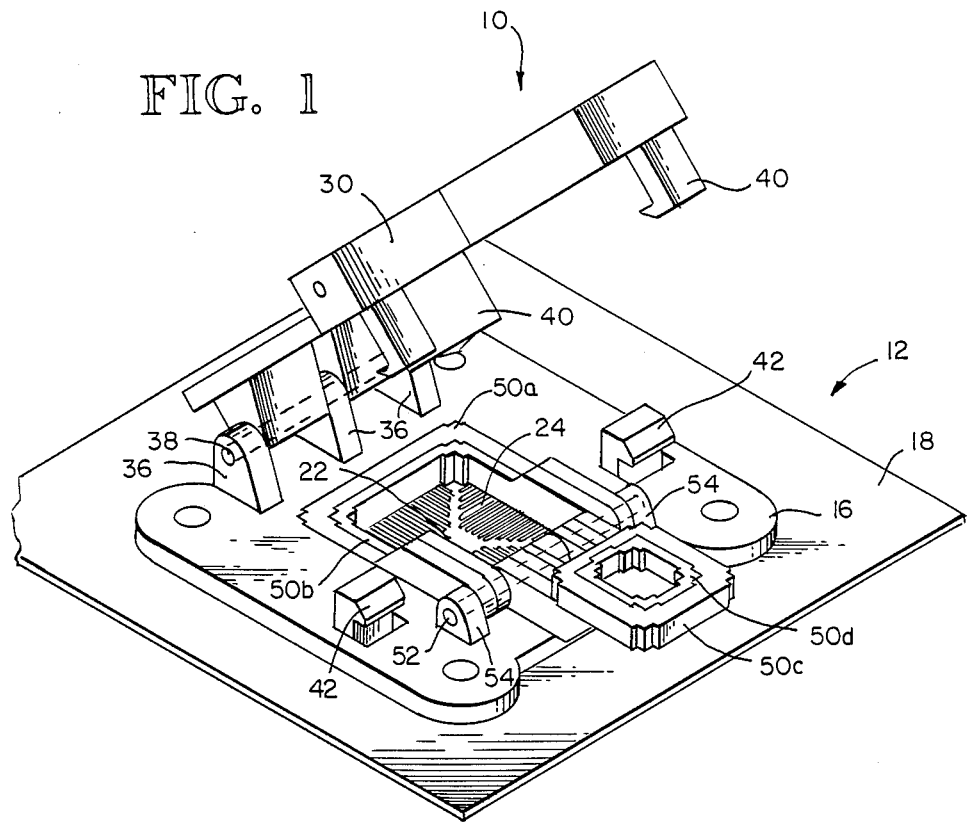
FIG. 1 is an isometric view of the inventive integrated circuit socket.
Figure 2:
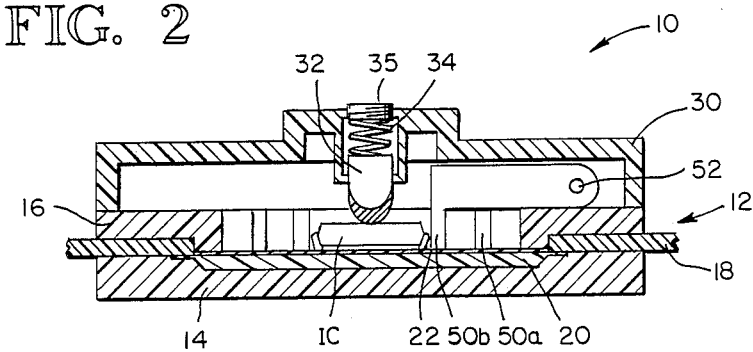
FIG. 2 is a cross-sectional view of the inventive integrated circuit socket.

The zero insertion force socket for integrated circuits 10, as best illustrated in FIGS. 1 and 2, includes a base 12 formed by a lower support member 14 (FIG. 2) and an upper support member 16. A circuit board 18 has formed therein a generally rectangular cutout to allow the circuit board 18 to fit between the upper support member 16 and the lower support member 14, as best illustrated in FIG. 2. The lower support 14 and upper support 12 are preferably somewhat rigid and may be formed by molding a suitable plastic.

The upper support member 16, together with the cutout in the circuit board 18, forms a recess having a generally square configuration. A resilient pad 20 (FIG. 2) is placed on the lower support member 4, and a flexible membrane 22 is mounted on the resilient pad 20 beneath the square recess formed by the upper support member 16 and circuit board 18. A contact pattern 24 (FIGS. 1 and 3) is formed on the flexible membrane 22. The conductors of the contact pattern are connected to printed circuit conductors on the printed circuit board 18, which, since they are conventional, are not illustrated in detail herein. The conductors on the circuit board 18, along with the conductors forming the contact pattern 24, are used to connect the leads of an integrated circuit to either other circuit components or a testing or programming device.

Although a resilient pad 20 and flexible membrane 22 are used to implement a resilient circuit in the embodiment illustrated in FIGS. 1 and 2, it will be understood that other designs may be used. For example, a resilient circuit can be implemented with a single resilient pad having a contact pattern formed on its upper surface. Also, as illustrated in FIGS. 4 and 5, the flexible membrane 22 may be placed over a rigid plate 26 on which a plurality of resilient dots 28 are placed. The dots 28 are arranged in a predetermined pattern so that a dot 28 will be beneath each area in which an integrated circuit lead makes contact with the contact pattern 24. If desired, strips of resilient material may be substituted for the dots 28.

As illustrated in FIG. 5, the dots 28 preferably project farther from the plate 26 away from the center of the contact pattern 24. Thus, for example, the inner row of dots 28a project only a short distance above the plate 26 while the outer row of dots 28d project a substantially greater distance above the plate. The increased height of the dots 28 away from the center ensures that the inner dots 28 will not space the leads of a relatively large integrated circuit above the outer dots. As a result, good contact with the contact pattern 24 is maintained for any size integrated circuit.

In use, a surface-mounted integrated circuit IC (FIG. 2) is placed on the flexible membrane 22 so that its leads make contact with the conductors of the contact pattern 24. Contact between the conductors of the contact pattern 24 and the leads of the integrated circuit IC is maintained by forcing the IC into the resilient pad 20 with a force sufficient to slightly compress the pad 20. For this purpose, a lid 30, having a plunger 32 resiliently biased in a downward direction by a spring 34, is placed over the integrated circuit. The lid 30 is pivotally mounted on the upper support frame 16 by upwardly projecting ears 36 through which a pin 38 extends. As best illustrated in FIG. 1, the lid 30 can be releasably latched in its closed position by a pair of latch members 40 on the lid 30 making contact with similar latch member 42 projecting upwardly from the upper support member 16. The latch members 40, 42 are somewhat resilient so that one can engage and disengage them from each other by exerting a force on the lid 30 sufficient to displace the latch members 40, 42 from each other.

After the integrated circuit IC is placed on the flexible membrane 22, the lid 30 is closed, as best illustrated in FIG. 2. The plunger 32 then contacts the case of the integrated circuit IC and compresses the spring 34. The magnitude of the force exerted by the spring 34 is proportional to the thickness of the integrated circuit. This force is applied to the flexible membrane 22 through the leads of the integrated circuit IC. The contact force between each lead and the each conductor of the contact pattern 24 formed on the flexible membrane 22 is thus inversely proportional to the number of leads in the integrated circuit IC. The plunger 32 preferably projects through a hole in the top of the lid 30 when it is displaced upwardly by an integrated circuit IC as shown in FIG. 2. The upper end of the plunger 32 may bear a highly visible marking 35 to make it more apparent that an integrated circuit is installed in the socket 10. When an integrated circuit is not installed in the socket 10, the top of the plunger 32 is flush with the top of the lid 30.

A unique aspect of the socket for integrated circuits is its ability to accommodate, without modification, integrated circuits having varying sizes and varying numbers of leads. In order to accurately position these integrated circuits of varying sizes at predetermined locations on the contact pattern 24, positioning frames 50 of varying size are positioned within the rectangular recess formed by the upper support member 16. As illustrated in FIGS. 1 and 2, the frames 50a-d each have a generally rectangular cutout that is adapted to fit around the cases of integrated circuits having varying sizes. As illustrated in FIGS. 1 and 2, the positioning frames 50 are preferably nested by configuring the frames 50b-d to fit into the generally rectangular recess formed in the next larger frame 50a-c. The frames 50 are pivotally mounted on a common pin 52 mounted on a pair of ears 54 projecting upwardly from the upper support member 16. The frames 50 are positioned on the upper support member 16 so that the centers of their respective, generally rectangular cutouts are positioned over predetermined locations on the contact pattern 24 when they are pivoted into the recess formed by the upper support member 16. For most integrated circuits, the center of the frame is positioned over the center of the contact pattern. However, the center of the frame for 32-pin, rectangular integrated circuits is positioned at a location that is offset from the center of the contact pattern. Thus, different frames 50 can be used not only to position integrated circuits of varying size, but they can also be used to alter the position of integrated circuits of the same size or different sizes in order to alter the connections between the integrated circuit leads and the conductors of the contact pattern 24.

As illustrated in FIGS. 1 and 2, the two largest positioning frames 50a, 50b are pivoted into the recess. An integrated circuit having a size and shape slightly smaller than the rectangular cutout formed in frame 50b can thus be placed in the frame 50b and accurately positioned with respect to the contact pattern 24. In the event that an integrated circuit having a smaller size is to be installed on the socket 10, the smaller positioning frames 50c or 50d can be pivoted into the recess formed by the upper support member 16 to accurately position the smaller integrated circuits on the contact pattern 24. The use of positioning frames having different sized cutouts allows the inventive socket to be used with integrated circuits having cases of various sizes.

Figure 8:
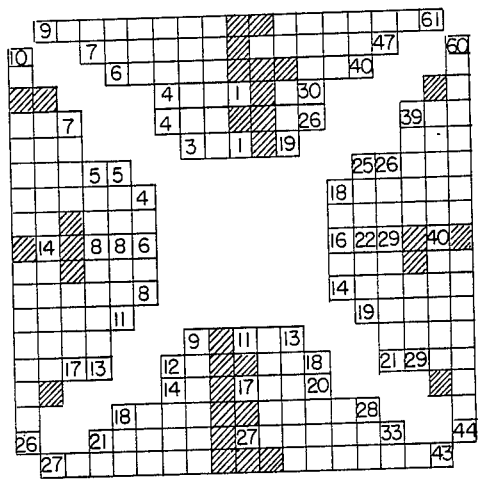
FIG. 8 is a schematic showing the arrangement of typical integrated circuit leads of varying sizes.

As mentioned above, a unique aspect of the inventive integrated circuit socket is its ability to be used with integrated circuits having varying numbers of leads. The manner in which the integrated circuit socket accommodates varying numbers of integrated circuit leads is best illustrated with reference to FIGS. 3, 6 and 7. With reference to FIG. 3, the conductors forming the contact pattern 24 are arranged in four sets symmetrically positioned about the center of the flexible membrane 22. The conductors in each set are shorter at their ends than they are at their centers. As a result, as illustrated in FIG. 6, a smaller integrated circuit having a smaller number of leads (i.e., five to a side) makes contact with only the five longest conductors of each set in the contact pattern 24. In contrast, as illustrated in FIG. 7, a larger, 32-pin, rectangular integrated circuit makes contact with inner conductors at each side of the integrated circuit and seven conductors at each end of the integrated The lead arrangement for typical integrated circuits is shown in FIG. 8, with the power and ground connections being shaded. It can be seen that the smallest side) and its power and ground connections are lead numbers 10 and 20. An integrated circuit that is larger by three of the increments illustrated in FIG. 8 will have a total of forty-four leads, and its power and ground connections will be through leads 43-1, 11-13, 22, 23, 33 and 34. The next larger size integrated circuit will have a total of fifty-two leads, and its power and ground connections will be on leads 1, 8, 20, 26, 34 and 46.

Figure 9:
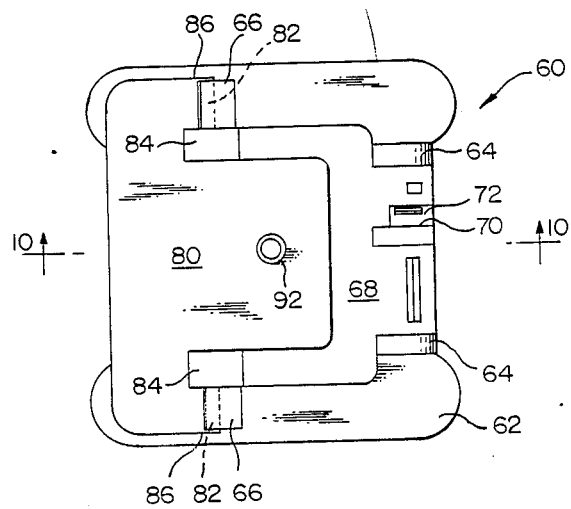
FIG. 9 is a top plan view showing an alternative embodiment of the inventive integrated circuit socket.
Figure 10:
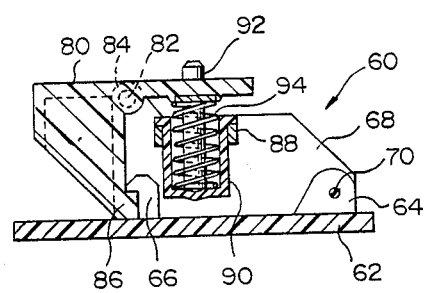
FIG. 10 is a cross-sectional view taken along the line 10—10 of FIG. 9.

An alternative embodiment of the inventive integrated circuit socket is illustrated in FIGS. 9 and 10. This embodiment utilizes the same contact pattern 24 and set of frames 50 as the embodiment of FIGS. 1 and 2, and differs from the earlier embodiment primarily in its lid structure.

The alternative embodiment 60 utilizes a generally square base 62 having a pair of spaced-apart bosses 64 and spaced-apart latch members 66 projecting upwardly therefrom. A lid 68 is pivotally mounted on the base 62 by a pin 70 extending through the lid 68 and the bosses 64. A coil spring 72 (FIG. 9) resiliently biases the lid 68 to an open position.

A latch 80 is pivotally mounted on the lid 68 by a pin 82 extending through the lid 68 between a pair of ears 84 formed on the latch 80. The low edge of the latch 80 terminates in a pair of latch members 86 that releasably engage the latch members 66 projecting upwardly from the base 62.

As best illustrated in FIG. 10, the lid 68 has formed therein a cylindrical recess 88 into which a hollow plunger 90 is slidably received. The plunger 90 has an integrally formed, upwardly extending indicating shaft 92 extending through the latch 80. A compression spring 94 surrounds the indicating shaft 92 within the plunger 90 and extends between the bottom of the plunger 90 and the lower surface of the latch 80. The spring 94 thus resiliently biases the plunger 90 in a downward direction. The spring 94 also resiliently biases the latch 80 to a latched position (i.e., counterclockwise as viewed in FIG. 10). The latch members 66, 86 are disengaged from each other by pressing downwardly on the latch 80 near its rightmost edge thereby further compressing the spring 94. The spring 94 thus serves the dual function of resiliently biasing the latch 80 to its engaged position and resiliently biasing the plunger 92 downwardly.

Figure 11:
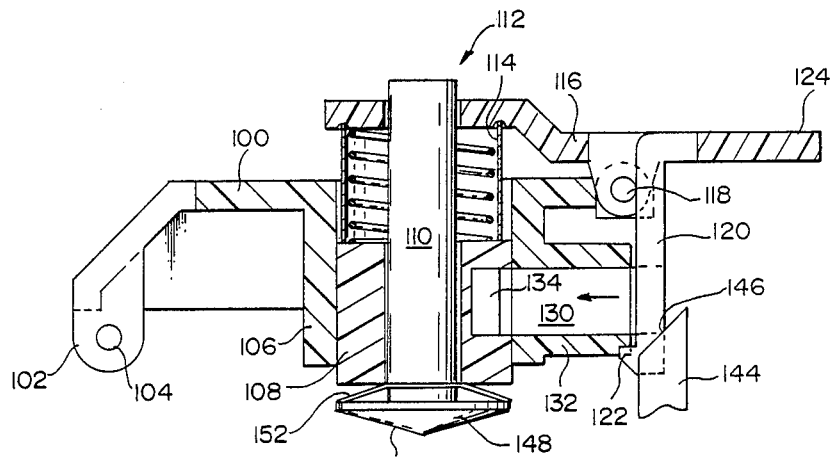
FIG. 11 is a cross-sectional view of an embodiment of a lid for an integrated circuit socket having a constant displacement plunger for providing a uniform contact force between each lead of an integrated circuit and a resilient circuit.
Figure 12:
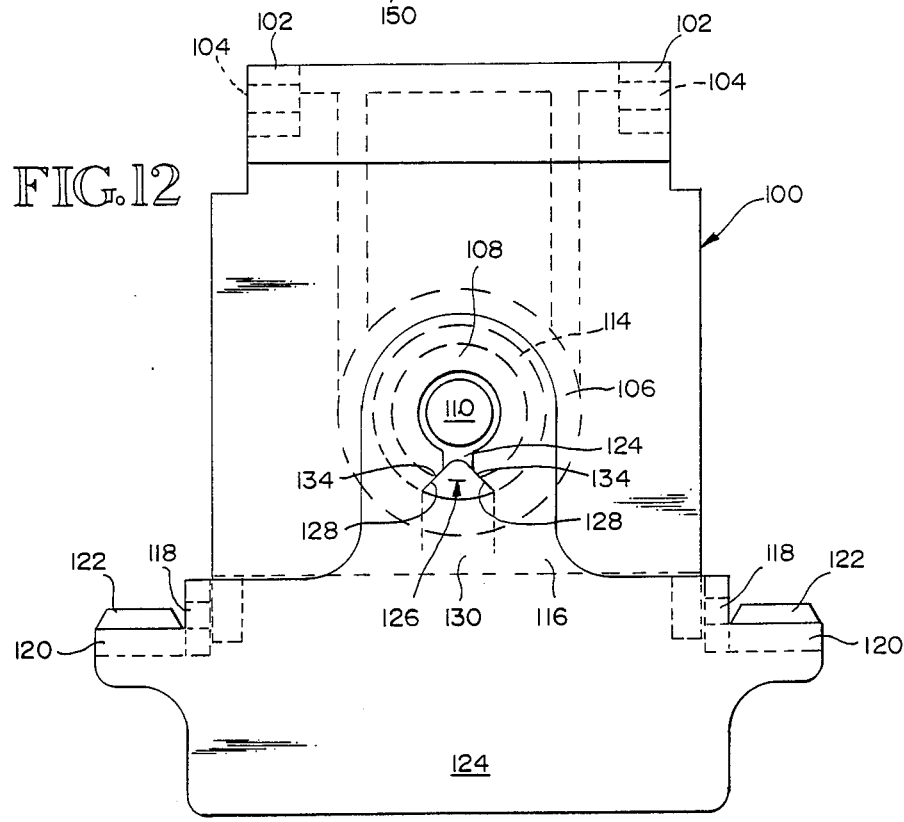
FIG. 12 is a top plan view of the integrated circuit socket lid of FIG. 11.

An alternative embodiment of a lid for the integrated circuit socket is illustrated in FIGS. 11 and 12. In this later embodiment, the lid includes an adaptive plunger that displaces the integrated circuit leads into the resilient circuit a constant distance regardless of the thickness of the integrated circuit or the number of leads in the integrated circuit. The embodiment of FIGS. 11 and 12 includes a lid 100 having a pair of spaced-apart, downwardly depending ears 102 having respective aligned bores 104. The lid 100 is supported on a base above a resilient circuit having a contact pattern, such as in the embodiment illustrated in FIGS. 1 and 2. When used with the base 12 shown in FIGS. 1 and 2, the bores 104 receive the pin 38 (FIG. 1) supported on the base 12 through a pair of spaced-apart, upstanding ears 36.

The lid 100 has formed therein a cylindrical guide 106 that slidable receives a cylindrical braking ring 108. The braking ring 108, in turn, slidable receives the cylindrical shaft 110 of a plunger 112. A compression spring 114 extends between the upper surface of the braking ring 108 and the end of a lever 116 having an aperature through which the upper end of the plunger shaft 110 extends. The lever 116 is pivotably mounted on the lid 100 be a pin 118 extending through respective bosses formed in the lid 100 and lever 116. A pair of arms 120 extend downwardly from the lever 116 and terminates in respective pawls 122 that are adapted to engage respective latch members 42 (FIG. 1) mounted on the base 12 of the socket. The pawls 122 hold the lid 100 in its closed position. The pawls 122 are disengaged from the latch members 42 by applying an upward force on outwardly projecting end 124 of the lever 116. The pawls 122 are resiliently biased to their latched position by the clockwise moment exerted on the lever 116 by the compression spring 114. The compression spring 114 thus performs the dual function of downwardly biasing the braking ring 108 and biasing the pawls 122 to their latched position.

As best illustrated in FIG. 12, the braking ring 108 is not continuous, but is instead broken by a slot 124 having a widened portion 126 formed by a pair of cam surfaces 128 (FIG. 12) converging toward the shaft 110 of the plunger 112. A brake actuator 130 slidable received in a guide member 132 (FIG. 11) formed in the lid 100 has a pair of wedge surfaces 134 that abut the cam surfaces 128 of the braking ring 108. As explained in greater detail below, when the brake actuator 130 is displaced in the direction of the arrow shown in FIGS. 11 and 12, it widens the slot 124 thereby forcing the outer surface of the braking ring 108 against the inner surface of the cylindical guide 106. The frictional force between the braking ring 108 and guide 106 locks the braking ring 108 and prevents it from moving axially within the guide 106. The brake actuator 130 is displaced in the direction of the arrow by a cam 144 (FIG. 11) abutting surface 146 on the outer end of the brake actuator 130 when the lid 100 is almost closed. The cam 134 extends upwardly from a base, such as the base 12 shown in FIG. 1.

As illustrated in FIG. 11, the lower end of the plunger 112 has formed thereon an increased diameter contact plate 148 (FIG. 11) having a slightly pointed lower contact surface 150. A spacer spring 152 (FIG. 11) extends around the shaft 110 of the plunger 112 between the upper end of the contact plate 148 and the lower end of the braking ring 108. As explained below, the position of the braking ring 108 is locked just prior to the lid 110 being closed and while the contact surface 150 of the contact plate 148 is contacting the upper surface of an integrated circuit positioned on the resilient circuit (FIGS. 1 and 2). Thereafter, the spacer spring 152 is allowed to compress while the position of the braking ring 108 is locked with increasing force. After the spacer spring 152 has been completely compressed, further closure of the lid 100 forces the integrated circuit into the resilient circuit.

In operation, the lid 100 is opened by lifting the end 124 of lever 116 thereby disengaging the pawls 122 from their respecive latch members 42. An integrated circuit is then placed on the resilient circuit beneath the lid 100, and the lid 100 is rotated toward its closed position. Before the contact surface 150 of the plunger 112 has made contact with the integrated circuit, the braking ring 108 is biased downwardly by the compression spring 114 to the position illustrated in FIG. 11. Also, the plunger 112 will be in the position illustrated in FIG. 11 at this time. As the lid 100 is closed further, the contact surface 150 of the plunger. 112 makes contact with the integrated circuit, thereby displacing the braking ring 108 upwardly within the cylindrical guide 106. However, when the lid 100 has being closed to the point where the surface 146 of the brake actuator 130 makes contact with the cam 144, the brake actuator 130 is displaced in the direction of the arrow shown in FIGS. 11 and 12. The wedge surfaces 128 of the brake actuator 130 then force the outer surface of the braking ring 108 against the inner surface of the cylindrical guide 106 to lock the braking ring 108 in position within the guide 106. As the lid 100 is closed further, the spacer spring 152 is compressed between the locked braking ring 108 and the integrated circuit while the brake actuator 130 continues to wedge the braking ring 108 against the guide 106 with increasing force. The spacer spring 152, being relatively compliant, thus allows the plunger 112 to move axially without exerting a significant force on the braking ring 108 while the braking ring 108 is being locked. However, it will be understood that the spacer spring 152 is not necessary to the operation of the socket. Without the spacer spring 152, the braking ring 108 might slip to some extent while the braking ring 108 is being locked. However, the amount of the slippage would be relatively slight and it would be independent of the thickness of the integrated circuit. By the time the spacer spring 152 has been fully compressed, the positon of the braking ring 108 has become fully locked by the increasing displacement of the brake actuator 130 as the lid 100 is closed further. At this point, the lid is a predetermined distance from being fully closed since the locking position of the braking ring 108 is determined by the position of the brake actuator 130 relative to the cam 144. Thus, further movement of the lid 100 to its fully closed position displaces the integrated circuit into the resilient circuit by a fixed distance regardless of the thickness of the integrated circuit. Each of the leads of the integrated circuit are also displaced into the resilient circuit by the fixed distance so that the contact force between the leads and the contact pattern on the integrated circuit is equal to the product of the fixed displacement and the spring constant of the resislient circuit. The contact force between each of the integrated circuit leads and the contact pattern on the resilient circuit is thus independent of the number of leads in the integrated circuit.

It is thus seen that integrated circuits having differing sizes and varying numbers of leads can be quickly and easily installed in the inventive integrated circuit socket. Moreover, the socket may be used a large number of times without any degradation in performance. The use of a resilient circuit, with the aid of an adaptive or a resilient plunger, maintains the contact between the integrated circuit leads and conductors of the contact pattern, and the use of frames of differing sizes and center locations accurately positions the integrated circuit on the contact pattern.

We claim:

1. A zero insertion force socket for integrated circuits, comprising:
    a base
    a resilient circuit having a predetermined contact pattern on its upper surface, said resilient circuit being mounted on said base;
    a rigid lid pivotally mounted on said base; and
    a plunger slidably mounted in and projecting downwardly from said lid at a position located so that the lower end of said plunger contacts the upper surface of said integrated circuit when said lid is in its closed position, said plunger being resiliently biased downwardly away from said lid so that it resiliently biases said integrated circuit downwardly and facilitates the use of said socket with integrated circuits having cases of varying thickness.

2. The integrated circuit socket of claim 1, wherein said lid further includes a releasable latch holding said lid in its closed position.

3. The integrated circuit socket of claim 1 wherein said lid further includes an aperture axially aligned with said plunger, and wherein said plunger has a length that is longer than the distance between the upper surface of said resilient circuit and the upper surface of said lid so that said plunger projects upwardly above said lid when said lid is closed and the lower end of said plunger is displaced above said resilient circuit by an integrated circuit inserted in said socket.

4. A zero insertion force socket for integrated circuits, comprising:
    a base;
    a resilient circuit having a predetermined contact pattern on its upper surface, said resilient circuit being mounted on said base;
    a rigid lid pivotally mounted on said base;
    a latch pivotally mounted on said lid and having a latch member releasably engaging said base to hold said lid in its closed position when a predetermined area of said latch moves upwardly, thereby pivoting said latch to its latched position; and
    a plunger mounted in said lid beneath said latch, said plunger having a lower end contacting the upper surface of said integrated circuit, said socket further including resilient bias means extending between said latch and plunger for urging the integrated circuit downwardly toward the resilient circuit.

5. A zero insertion force socket for integrated circuits, comprising:
    a base;
    a resilient circuit mounted on said base, said circuit having a predetermined contact pattern on its upper surface, said contact pattern including four sets of parallel, elongated conductors, with the longitudinal axis of the conductors in each set being perpendicular to the longitudinal axis of the conductors in adjacent sets and parallel to the longitudinal axis of the conductors in the opposite set, the conductors at the ends of each set having a length that is shorter than the length of at least some of the conductors at the center of each set, such that the number of conductors in contact with the leads of an integrated circuit positioned in said socket increases with the size of such integrated circuit.

6. The integrated circuit socket of claim 5 wherein N center conductors of each set have the same length so that the N center conductors of all four sets are arranged in a rectangle.

7. A zero insertion force socket for integrated circuits, comprising:
    a base;
    a rigid support mounted on said base;
    a predetermined pattern of resilient material movable on said rigid support, said predetermined pattern being symmetrical about a center, and the thickness of said resilient material forming said pattern becoming greater the farther that said resilient material is spaced from the center of said pattern;
    a flexible membrane mounted on said resilient material, said flexible membrane having a contact pattern formed thereon; and
    a bias mechanism positioned above said resilient circuit, said bias adapted to contact the upper surface of an integrated circuit case placed on said resilient circuit with its leads contacting said contact pattern, whereby said bias mechanism compresses said resilient circuit to maintain the leads of said integrated circuit in contact with the contact pattern of said resilient circuit.

8. A zero insertion force socket for integrated circuits, comprising:
    a base;
    a resilient circuit having a predetermined contact pattern on its upper surface, said resilient circuit being mounted on said base;
    a bias mechanism positioned above said resilient circuit, said bias mechanism being adapted to contact the upper surface of an integrated circuit case placed on said resilient circuit with it leads contacting said contact pattern, whereby said bias mechanism compresses said resilient circuit to maintain the leads of said integrated circuit in contact with the contact pattern of said resilient circuit; and
    a positioning frame mounted on said base, said frame including a rectangular cutout having a center positioned over a location on said contact pattern that is offset from the center of said contact pattern, said rectangular cutout being adapted to surround the case of an integrated circuit to position said integrated circuit over said predetermined location on said contact pattern.

9. A zero insertion force socket for integrated circuits, comprising:
    a base;
    a resilient circuit having a predetermined contact pattern on its upper surface, said resilient circuit being mounted on said base;

a bias mechanism positioned above said resilient circuit, said bias mechanism being adapted to contact the upper surface of an integrated circuit case placed on said resilient circuit with it leads contacting said contact pattern, whereby said bias mechanism compresses said resilient circuit to maintain the leads of said integrated circuit in contact with the contact pattern of said resilient circuit; and a positioning frame pivotally mounted on said base, said frame including a rectangular cutout having a center positioned over a predetermined location on said contact pattern, said rectangular cutout being adapted to surround the case of an integrated circuit to position said integrated circuit over said predetermined location on said contact pattern.

10. A zero insertion force socket for integrated circuits, comprising:

a base;

a resilient circuit having a predetermined contact pattern on its upper surface, said resilient circuit being mounted on said base;

a bias mechanism positioned above said resilient circuit, said bias mechanism being adapted to contact the upper surface of an integrated circuit case placed on said resilient circuit with it leads contacting said contact pattern, whereby said bias mechanism compresses said resilient circuit to maintain the leads of said integrated circuit in contact with the contact pattern of said resilient circuit; and a plurality of positioning frames mounted on said base, said frames having respective rectangular cutouts positionable with their centers positioned over respective predetermined locations on said contact pattern, said rectangular cutouts being adapted to surround the case of an integrated circuit to position said integrated circuit over respective predetermined locations on said contact pattern, the rectangular cutouts of said frame differing in size from each other so that different frames can be used to position integrated circuits having different sized cases over respective predetermined locations on said contact pattern.

11. The integrated circuit socket of claim 10 wherein said frames are pivotally mounted on said base in a nesting arrangement in which at least some of the frames fit within respective rectangular cutouts of other frames.

12. The integrated circuit socket of claim 10 wherein at least some of said frames have cutouts with their respective centers positioned over different locations on said contact pattern.

13. A zero insertion force socket for integrated circuits, comprising:

a base;

a resilient circuit having a predetermined contact pattern on its upper surface, said resilient circuit being mounted on said base;

a rigid lid pivotally mounted on said base;

constant displacement means mounted on said lid and contacting the upper surface of an integrated circuit case placed on said resilient circuit, said constant displacement means biasing said integrated circuit into said resilient circuit by a fixed predetermined distance when said lid is closed independently of the thickness of said integrated circuit.

14. The integrated circuit socket of claim 13, wherein said constant displacement means comprise:

a plunger having a contact surface adapted to contact the upper surface of an integrated circuit that is mounted in said socket when said lid is closed, said plunger being slidably mounted in said lid so that said plunger can move toward and away from said integrated circuit as said plunger slides in said lid;

bias means resiliently urging said plunger toward said integrated circuit so that the contact surface of said plunger contacts the upper surface of said integrated circuit when said lid is closed; and, braking means for locking the position of said plunger within said lid when said lid has been closed to a predetermined position whereby further closing of said lid displaces said integrated circuit into said resilient circuit by a fixed distance.

15. The integrated circuit socket of claim 14 wherein said braking means comprise:

a braking ring slidably mounted in a guide member carried by said lid, said guide member permitting axial movement of said ring toward and away from said resilient circuit when said lid is closed, said braking ring having a slot formed therein to allow said ring to expand against said guide member; and a braking member carried by said base, said braking member having a wedge that is urged into the slot of said braking ring when said lid has been closed to a predetermined position thereby extending said braking ring and causing it to frictionally engage said guide member to lock said braking ring in said lid.

16. The integrated circuit socket of claim 14, wherein said plunger is slidably mounted in a plunger mount that is, in turn, slidably mounted in said lid, said bias means resiliently biasing said plunger through said plunger mount and said braking means locking said plunger through said plunger mount, said socket further including a stop member for preventing said plunger from moving within said plunger mount away from said integrated circuit, said stop member permitting limited movement of said plunger within said plunger mount as said braking means is being applied so that said braking means can be fully applied before said plunger forces said integrated circuit into said resilient circuit.

17. The integrated circuit socket of claim 16, wherein said stop member includes a spring extending between said plunger and said plunger mount and urging said plunger toward said integrated circuit, said spring being substantially more compliant than said resilient circuit.

18. A zero insertion force socket for integrated circuits, comprising:

a rigid base;

a contact pattern mounted on said base, said contact pattern having four sets of parallel, elongated conductors, the longitudinal axis of the conductors in each set being perpendicular to the longitudinal axis of the conductors in adjacent sets and parallel to the longitudinal axis of the conductors in the opposite set, the conductors at the ends of each set being shorter in length than at least some of the conductors at the center of each set, such that the number of conductors positioned beneath an integrated circuit in said socket increases with the size of such integrated circuit;

a plurality of frames pivotally mounted about a common axis on said base, said frames having respective, different sized rectangular cutouts adapted to surround integrated circuit cases of differing sizes, said frames being nested so that at least some of the frames fit within the respective rectangular cutouts of other frames, said frames being pivotable between an in-use position in which the center of the rectangular cutout for each frame is positioned over a respective predetermined location on said rectangular pattern and a standby position in which said frame is pivoted away from said contact pattern; and a lid pivotally mounted on said base and movable between a closed position in which said lid covers said contact pattern an any frame in its in-use position and an open position in which said contact pattern and frames are externally accessible, said lid further biasing said integrated circuit against said contact pattern.

19. The integrated circuit socket of claim 18 wherein said lid further includes a releasable latch holding said lid in its closed position.

20. The integrated circuit socket of claim 18 wherein the N center conductors of each set have the same length so that the N center conductors of all four sets are arranged in a rectangle.

21. The integrated circuit socket of claim 18 wherein said contact pattern comprises a resilient pad mounted on said base and a flexible membrane mounted on said resilient pad, said flexible membrane having a conductor pattern formed thereon.

22. The integrated circuit socket of claim 18 wherein the centers of at least some of said frames are positioned over different locations on said contact pattern when they are in their in-use position.

23. The integrated circuit socket of claim 18 wherein said lid further including a plunger projecting from said lid at a location that positions said plunger over the center of any frame in its in-use position when said lid is in its closed position, said plunger being resiliently biased toward said contact pattern when said lid is in its closed position.

24. The integrated circuit socket of claim 18 wherein said contact pattern comprises a flexible membrane having a conductor pattern formed thereon, a rigid support mounted on said base, and a pattern of dots of resilient material mounted on and extending upwardly from said support, said dots coinciding with the areas of contact between said contact pattern and the leads of integrated circuits that can be inserted in said socket.

25. The integrated circuit socket of claim 24 wherein said conductor pattern and pattern of dots are symmetrical about a common center, and wherein the thickness of the resilient material forming each of said dots increases in proportion to the distance between each of said dots and the center of said pattern of dots.

26. A method of making contact with the leads of integrated circuits having a plurality of different sizes and shapes, said method comprising placing said integrated circuits in one of a plurality of frames having respective rectangular cutouts sized and shaped to correspond to the different sizes and shapes of said integrated circuit cases, said frames being positioned with the centers of their respective rectangular cutouts over a predetermined location on a predetermined contact pattern so that the leads of said integrated circuit rest on said contact pattern, and then applying a force on said integrated circuit toward said contact pattern so that the leads of said integrated circuit make contact with said contact pattern.

27. The method of claim 26 wherein said contact pattern comprises four sets of parallel, elongated conductors, with the longitudinal axis of the conductors in each set being arranged perpendicular to the longitudinal axis of the conductors in adjacent sets and parallel to the longitudinal axis of the conductors in the opposite set, said sets of conductors being symmetrically arranged about a center.

28. The method of claim 27 wherein the conductors at the ends of each set are shorter in length than at least some of the conductors at the center of each set, such that the number of conductors positioned on said contact pattern increases with the size of such integrated circuit.

29. The method of claim 26 wherein said frames are positioned with their respective centers positioned over different predetermined locations on said contact pattern.

30. The integrated circuit socket of claim 29 wherein said conductor pattern and pattern of dots are symmetrical about a common center, and wherein the thickness of the resilient material forming each of said dots increases in proportion to the distance between each of said dots and the center of said pattern of dots.

* * * * *

UNITED STATES PATENT AND TRADEMARK OFFICE
CERTIFICATE OF CORRECTION

PATENT NO. : 4,840,576

DATED : June 20, 1989

INVENTOR(S) : David Nierescher, Douglas Yip

It is certified that error appears in the above-identified patent and that said Letters Patent is hereby corrected as shown below:

In column ten, claim seven, line 34, before "adapted", please insert --mechanism being--.

In column eleven, claim nine, line four, please delete "it" and substitute therefor --its--.

In column eleven, claim ten, line 26, please delete "it" and substitute therefor --its--.

In column eleven, claim ten, line 39, please delete "frame" and substitute therefor --frames--.

In column 12, claim 15, line 27, please delete "extending" and substitute therefor --expanding--.

In column 13, claim 18, line 12, please delete "an" and substitute therefor --and--.

Signed and Sealed this

Twenty-second Day of May, 1990

*Attest:*

HARRY F. MANBECK, JR.

*Attesting Officer*     *Commissioner of Patents and Trademarks*